(12) United States Patent
Sharma et al.

(10) Patent No.: US 9,164,943 B2
(45) Date of Patent: Oct. 20, 2015

(54) SELF CORRECTION LOGIC FOR SERIAL-TO-PARALLEL CONVERTERS

(75) Inventors: Anil Sharma, Santa Clara, CA (US); Kanaka Lakshimi Siva Prasad Gadey Naga Venkata, Fremont, CA (US); Gurushankar Rajamani, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,906

(22) PCT Filed: Jan. 18, 2012

(86) PCT No.: PCT/US2012/021675
§ 371 (c)(1),
(2), (4) Date: Jun. 25, 2013

(87) PCT Pub. No.: WO2013/109263
PCT Pub. Date: Jul. 25, 2013

(65) Prior Publication Data
US 2014/0223045 A1    Aug. 7, 2014

(51) Int. Cl.
*G06F 3/00*     (2006.01)
*G06F 13/12*    (2006.01)
*G06F 11/00*    (2006.01)
(Continued)

(52) U.S. Cl.
CPC .......... *G06F 13/4018* (2013.01); *G06F 13/374* (2013.01); *G06F 13/4072* (2013.01); *H03M 9/00* (2013.01); *G06F 2213/0026* (2013.01)

(58) Field of Classification Search
CPC ........... G06F 5/01; G06F 5/08; G06F 13/374; G06F 13/4018; G11C 7/1018; G11C 7/1036; G11C 8/04; G11C 19/00; H04L 1/004; H04L 7/0016; H04L 9/304; H04L 49/55

USPC ...................... 710/71; 375/354; 714/704, 807
See application file for complete search history.

(56) References Cited

U.S. PATENT DOCUMENTS 3,656,107 A * 4/1972 Hsiao et al. .................... 714/753
3,836,956 A * 9/1974 Cross ............................ 714/811
(Continued)

OTHER PUBLICATIONS

PCT/US2012/021675 Notification Concerning Transmittal of International Preliminary Report on Patentability, mailed Jul. 31, 2014, 7 pages.

(Continued)

*Primary Examiner* — Farley Abad
*Assistant Examiner* — Henry Yu
(74) *Attorney, Agent, or Firm* — Blakely, Sokoloff, Taylor & Zafman LLP

(57) ABSTRACT

Embodiments of the invention describe an apparatus, system and method for executing self-correction logic for serial-to-parallel data converters. Embodiments of the invention receive one of a plurality of serial data streams from a peripheral device, each of the serial data streams having one or more bits. In response to detecting that a shift register chain includes a register select value, embodiments of the invention may store the received serial data stream in one of a plurality of data registers, wherein the one data register is selected based, at least in part, on a position of the register select value in the shift register chain. In response to detecting the shift register chain does contain the register select value, embodiments of the invention may insert the register select value at a register of the shift register chain.

17 Claims, 5 Drawing Sheets

(51) Int. Cl.
*H03M 13/00* (2006.01)
*G06F 11/10* (2006.01)
*H04L 7/00* (2006.01)
*G06F 13/40* (2006.01)
*H03M 9/00* (2006.01)
*G06F 13/374* (2006.01)

(56) References Cited

U.S. PATENT DOCUMENTS

| | | | | |
|---|---|---|---|---|
| 3,987,278 | A | * | 10/1976 | Van Elzakker et al. ....... 235/436 |
| 4,158,193 | A | * | 6/1979 | D'Antonio ................... 714/707 |
| 5,570,380 | A | * | 10/1996 | Gadducci et al. ............. 714/811 |
| 6,437,714 | B1 | * | 8/2002 | Kim et al. ....................... 341/81 |
| 7,165,195 | B2 | * | 1/2007 | Bedwani ....................... 714/704 |
| 7,322,000 | B2 | | 1/2008 | Colunga et al. |
| 7,870,449 | B2 | | 1/2011 | Waayers |
| 2003/0196130 | A1 | * | 10/2003 | Pastorello ..................... 713/400 |
| 2005/0232020 | A1 | | 10/2005 | Perego et al. |
| 2006/0050819 | A1 | * | 3/2006 | Van Houdt et al. ........... 375/354 |
| 2009/0094507 | A1 | * | 4/2009 | Nakase ......................... 714/807 |
| 2012/0192044 | A1 | * | 7/2012 | Shafai et al. .................. 714/807 |

OTHER PUBLICATIONS

"PCT, International Search Report of the International Searching Authority for Int'l Application No. PCT/US2012/021675", (Oct. 8, 2012), Whole Document.

* cited by examiner

SELF CORRECTION LOGIC FOR SERIAL-TO-PARALLEL CONVERTERS

CLAIM OF PRIORITY

This application is a U.S. National Phase application under 35 U.S.C. §371 of International Application No. PCT/US2012/021675, filed Jan. 18, 2012, entitled "SELF CORRECTION LOGIC FOR SERIAL-TO-PARALLEL CONVERTERS," the entire contents of which are incorporated herein by reference.

FIELD

Embodiments of the invention generally pertain to computing devices and more particularly to self correction logic for serial-to-parallel converters.

BACKGROUND

Peripheral Component Interconnect express (PCIe) (as described, for example, in The PCI Express Base Specification of the PCI Special Interest Group, Revision 3.0 published Nov. 18, 2010) describes an interconnection standard for coupling peripheral devices to a host computing system. The inbound data on a PCI express (PCIe) link is of serial form, running at a high clock frequency. The digital logic on the respective host system runs at a magnitude of half or more of that clock frequency. Before the data can be handed over to the digital logic, it is required to be converted to a parallel data format so that digital logic running at a lower clock frequency can handle all the incoming data. This serial-to-parallel conversion is done using a Serial In Parallel Out or Serial-To-Parallel Converter (SIPO).

A SIPO employs a serial shift register to implement the control logic required to load the serial data internally using the high clock frequency. System errors, such as clock glitches resulting from noise or system initialization processes, can render the serial shift register inoperable, which would mandate a system reset for re-initializing the PCIe link. What is needed is self-correction logic for serial-to-parallel converters, such as the above described converters used in PCIe links.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of an apparatus, system and method for utilizing self-correction logic in a Serial In Parallel Out or Serial-To-Parallel converter (SIPO) are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Embodiments of the invention described below receive one of a plurality of serial data streams from a peripheral device, each of the serial data streams having one or more bits. In response to detecting that a shift register chain includes a register select value, embodiments of the invention may store the received serial data stream in one of a plurality of data registers, wherein the one data register is selected based, at least in part, on a position of the register select value in the shift register chain. In response to detecting the shift register chain does contain the register select value, embodiments of the invention may insert the register select value at a register of the shift register chain.

Figure 1:
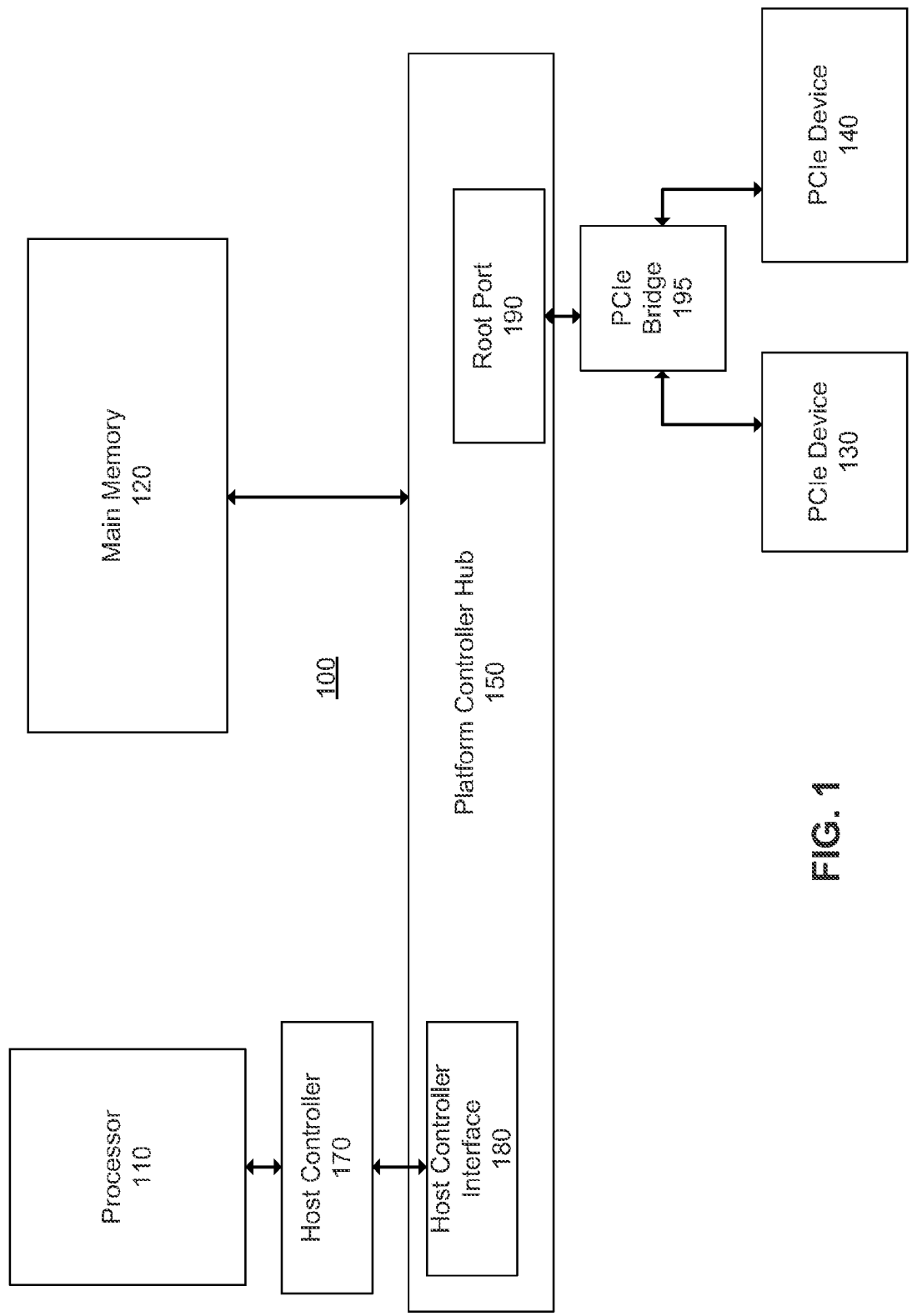
FIG. 1 is a block diagram of host platform hardware according to an embodiment of the disclosure.

FIG. 1 is a block diagram of host platform hardware according to an embodiment of the disclosure. The components of figures as illustrated represent the various logical functions of embodiments of the invention as described below, and are not drawn to limit embodiments of the invention to any specific configuration (e.g., any or all components illustrated in FIG. 1 may be included in the same chip or device).

In this embodiment, host system 100 includes processor 110 and main memory 120, which may include any combination of volatile and non-volatile memory, and may include an OS to be executed by processor 110.

Host controller 170 may be any controller capable of exchanging data and/or commands with a storage device, via host controller interface 180, in accordance with, for example, any of a Small Computer Systems Interface (SCSI) protocol, a Fibre Channel (FC) protocol, a SCSI over Internet Protocol (iSCSI), a Serial Attached SCSI (SAS) protocol, a Universal Serial Bus (USB) protocol and a SATA protocol.

In accordance with this embodiment, if host controller 170 is to exchange data and/or commands with a memory device in accordance with a SCSI protocol, the SCSI protocol may comply and/or be compatible with the protocol described in American National Standards Institute (ANSI) Small Computer Systems Interface-2 (SCSI-2) ANSI/InterNational Committee for Information Technology Standards (INCITS) 131-1994 Specification.

If host controller 170 is to exchange data and/or commands with a memory device in accordance with an FC protocol, the FC protocol may comply and/or be compatible with the protocol described in ANSI Standard Information Technology—Fibre Channel (FC) Physical and Signaling Interface-3 ANSI/INCITS 303-1998 (R2003) Specification.

If host controller 170 is to exchange data and/or commands with a memory device in accordance with an SAS protocol, the SAS protocol may comply and/or be compatible with the protocol described in ANSI Standard "Information Technology—Serial Attached SCSI (SAS-2), ANSI/INCITS 457-2010 Specification.

If host controller 170 is to exchange data and/or commands with a memory device in accordance with a SATA protocol, the SATA protocol may comply and/or be compatible with the protocol previously described.

If host controller 170 is to exchange data and/or commands with a memory device in accordance with a Universal Serial Bus (USB) Attached SCSI (UAS) protocol, the UAS protocol may comply and/or be compatible with the protocol described in Information Technology—USB Attached SCSI (UAS) T10 Working document T10/2095-D Revision 4 Mar. 9, 2010.

If host controller 170 is to exchange data and/or commands with a memory device in accordance with an iSCSI protocol, the iSCSI protocol may comply and/or be compatible with the protocol described in "Internet Small Computer Systems Interface (iSCSI)" Network Working Group, Request for Comments: 3720, RFC—Proposed Standard (IETF Stream) published April 2004 by the Internet Engineering Task Force, Internet Engineering Task Force Secretariat c/o Corporation for National Research Initiatives, 1895 Preston White Drive, Suite 100, Reston, Va. 20191, United States of America.

Of course, alternatively or additionally, host controller 170 may exchange data and/or commands with a memory device via one or more other and/or additional protocols without departing from this embodiment.

Platform Controller Hub (PCH) 150 may include modules or logic to manage the interconnections between the above described components of host system 100 and various peripheral devices. PCIe devices 130 and 140 are shown to be coupled to PCIe bridge 195, which is coupled to root port 190. It is understood that PCIe bridge acts as a "switch" for PCIe devices 130 and 140, while root port 190 acts as an interconnect to processor 110 and main memory 120.

Host system 100 may receive data from peripheral devices in serial form; before the data is handed over to components of host system 100, the serial data is converted to parallel data format so that digital logic running at a lower clock frequency can handle all the incoming data.

Figure 2:
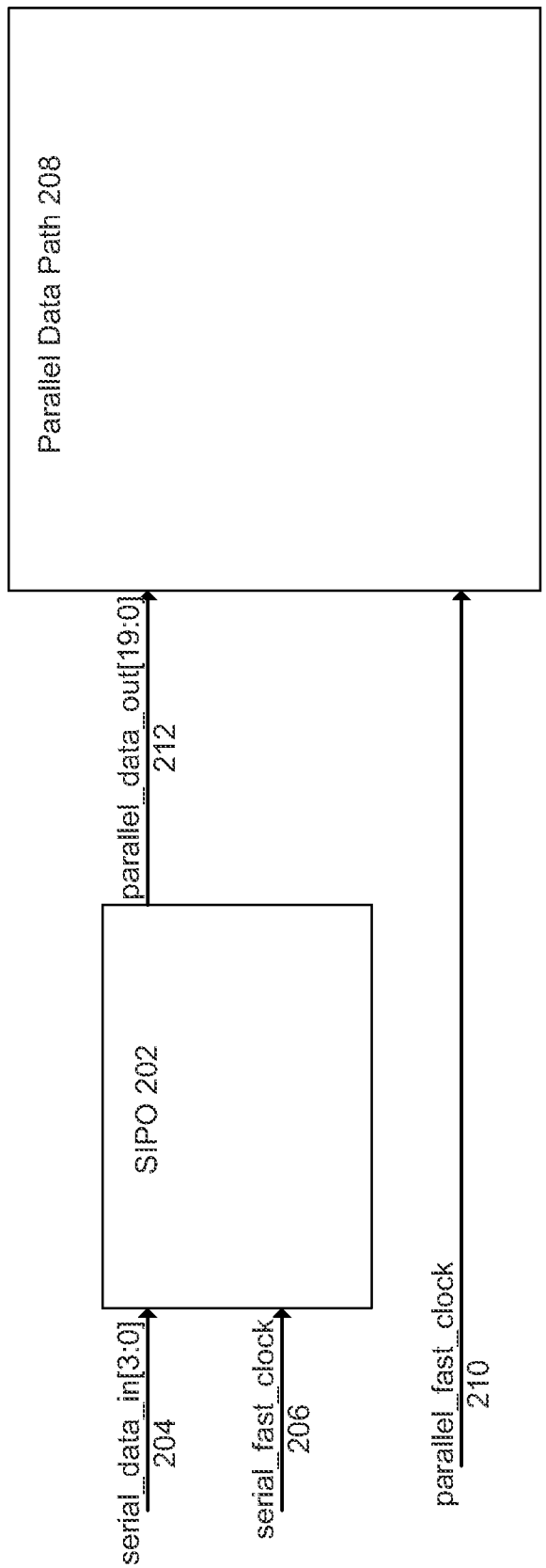
FIG. 2 is a block diagram of a serial-to-parallel data path according to an embodiment of the disclosure.

FIG. 2 is a block diagram of a serial-to-parallel data path according to an embodiment of the disclosure. SIPO 202 is shown as receiving serial_data_in 204 and serial_fast_clock 206. In this embodiment, serial_data_in 204 is 4-bit wide serial data coming from an Analog Front End (AFE)—i.e., it is 4 bits per cycle of serial_fast_clock 206.

SIPO 202 collects a total of 20 bits of data over 5 cycles before sending parallel_data_out 212 (having 20 bits) to parallel data path 208. Said parallel data path may be, for example, the physical (PHY) layer of a PCIe link. Parallel_data_out is shown to be sent based on parallel_fast_clock 210.

SIPO 202 may employ a serial shift register (described below) to implement the control logic required to load the serial data internally using the fast clock. In some embodiments, as described below, this serial-shift register functions similar to a ring-counter having a token which keeps re-circulating. This serial-shift register control logic may also be referred to as decimator.

SIPO 202 may be utilized by the PCIe PHY layer to receive data via a PCIe link. Said PHY layer may include logic to support features such as such as data serialization and deserialization, 8b/10b encoding, analog buffers, elastic buffers and receiver detection. The primary focus of the PHY layer is to shift the clock domain of the inbound data from the PCIe rate to one that is compatible with the general logic in the host system by utilizing SIPO 202.

There are two clocks signals used by PHY Interface components. The first clock is a reference clock that the PHY uses to generate internal bit rate clocks for transmitting and receiving PCIe data. The specifications for this signal are implementation dependent. The second clock is an output from the PHY and is the parallel interface clock used to synchronize data transfers across the parallel interface.

When the PHY is reset (e.g., initial power on for the host system, power management states that allow the PHY to minimize power consumption), the PHY is held in reset until power and clock inputs to the PHY are stable—i.e., the PHY must meet all timing constraints regarding clock recovery and link training for the various power states. The PHY must also meet all terminations requirements for transmitters and receivers. It is during this state that errors may be introduced into the serial-shift register control logic for SIPO 202.

Figure 3:
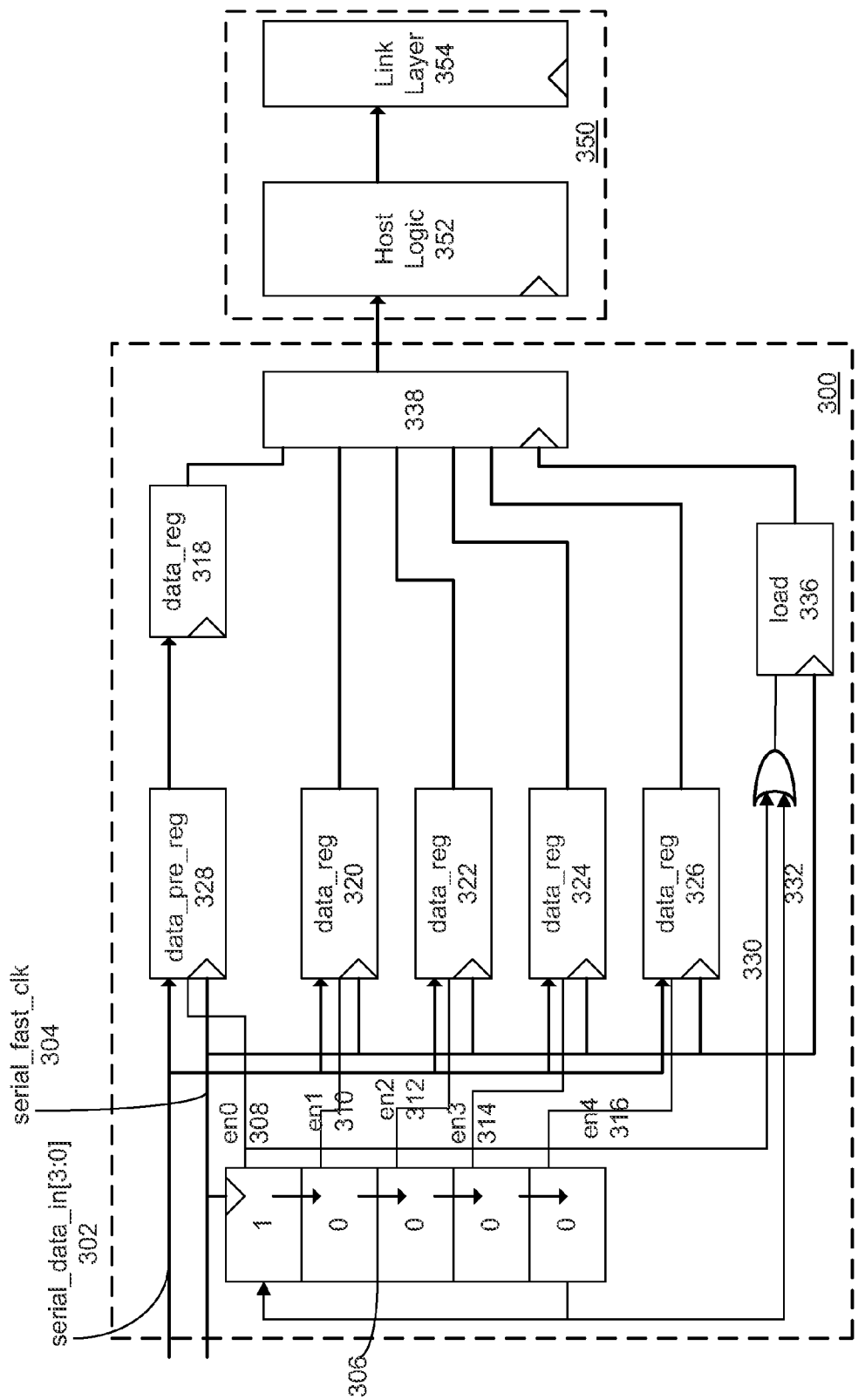
FIG. 3 is a block diagram of a serial-to-parallel converter utilizing serial-shift register control logic according to an embodiment of the disclosure.

FIG. 3 is a block diagram of a serial-to-parallel converter utilizing serial-shift register control logic according to an embodiment of the disclosure. SIPO 300 receives serial_data_in 302, comprising 4-bits, and serial data fast clock 304, from a peripheral device and collects a total of 20 bits of data over 5 cycles before sending data to parallel data path 350. It is to be understood that while shown to support receiving serial_data_in 302 from peripheral device via a PCIe link, SIPO 300 may include logic designed to receive serial data from any type of link and convert it to parallel data to be received by any parallel data path of the host system.

In this embodiment, SIPO 300 is shown to accumulate data via 4-bit data registers 318 (for bits 4:0 of a 20 bit data stream) 320 (for bits 7:4), 322 (for bits 11:8), 324 (for bits 15:12) and 326 (for bits 19:16). Serial_data_in 302 is directed to one of said 4-bit data registers based on the output of serial shift register 306.

The output of each register of serial shift register 306 is shown to enable one of 4-bit data registers 318-326 to store serial_data_in 302. In this embodiment, en0 308 enables data register 318 to store data, en1 310 enables data register 320 to store data, en2 312 enables data register 322 to store data, en3 314 enables data register 324 to store data and en4 316 enables data register 326 to store data.

In this embodiment, parallel_data_out logic 338 is shown to transmit accumulated data from 4-bit data registers 318-326 based on load strobe logic 336. 20-bit data streams are thus created when write signal 332 is asserted, which in this embodiment is based on en4 316—i.e., when register 326 is enabled to capture bits 19:15, 4-bit data registers 318-326 contain a whole 20-bit data stream, which is to be acquired by parallel_data_out logic 338 (i.e., similar to a de-multiplexing operation) and asserted to parallel data path 350. SIPO 300 is also capable of acquiring data prefix data via data register 328, and is asserted to parallel_data_out logic 338 based on data prefix signal 330.

Thus, shift-register 306 may be described to include a token that is re-circulated in a ring fashion. As previously mentioned, it is possible to lose the token-bit because of some glitches in clock during PHY initialization. If this token-bit is lost, the entire SIPO and the parallel data-path stops working as no new data gets latched and components such as host logic 352 and link layer 354 may not initialize properly, and prior art solutions would require a hard system reset to become operational.

|     | c_0 | c_1 | c_2 | c_3 | c_4 | c_5 | c_6 | c_7 | c_8 |
| --- | --- | --- | --- | --- | --- | --- | --- | --- | --- |
| en0 | 1 | 0 | 0 | 0 | 0 | 1 | 0 | 0 | 1 |
| en1 | 0 | 1 | 0 | 0 | 0 | 0 | 1 | 0 | 0 |
| en2 | 0 | 0 | 1 | 0 | 0 | 0 | 0 | 0 | 0 |
| en3 | 0 | 0 | 0 | 1 | 0 | 0 | 0 | 0 | 0 |
| en4 | 0 | 0 | 0 | 0 | 1 | 0 | 0 | 0 | 0 |

As illustrated in the table above, the shift register 306 is functioning properly until cycle 7. In every cycle, the token is passed to the next register, and at the end of 5 cycles, the token is re-circulated back to the first flop. At cycle 7, due to a system error (e.g., clock glitches described above), the token bit gets lost and there is no activity in the logic from that point of time. Cycle 8 illustrates that in this embodiment, when the token is detected to be lost self-correction logic injects the token back into shift register 302. In one embodiment of the invention, where the data received from the peripheral device is necessary to be received in a certain order (e.g., link training data), the peripheral device is notified that shift register 302 has been initialized to expect data corresponding serial data for bits 4:0 of a 20 bit data stream, so that the peripheral device may send data accordingly (e.g., the peripheral device may resend data from cycle 5 and cycle 6).

Figure 4:
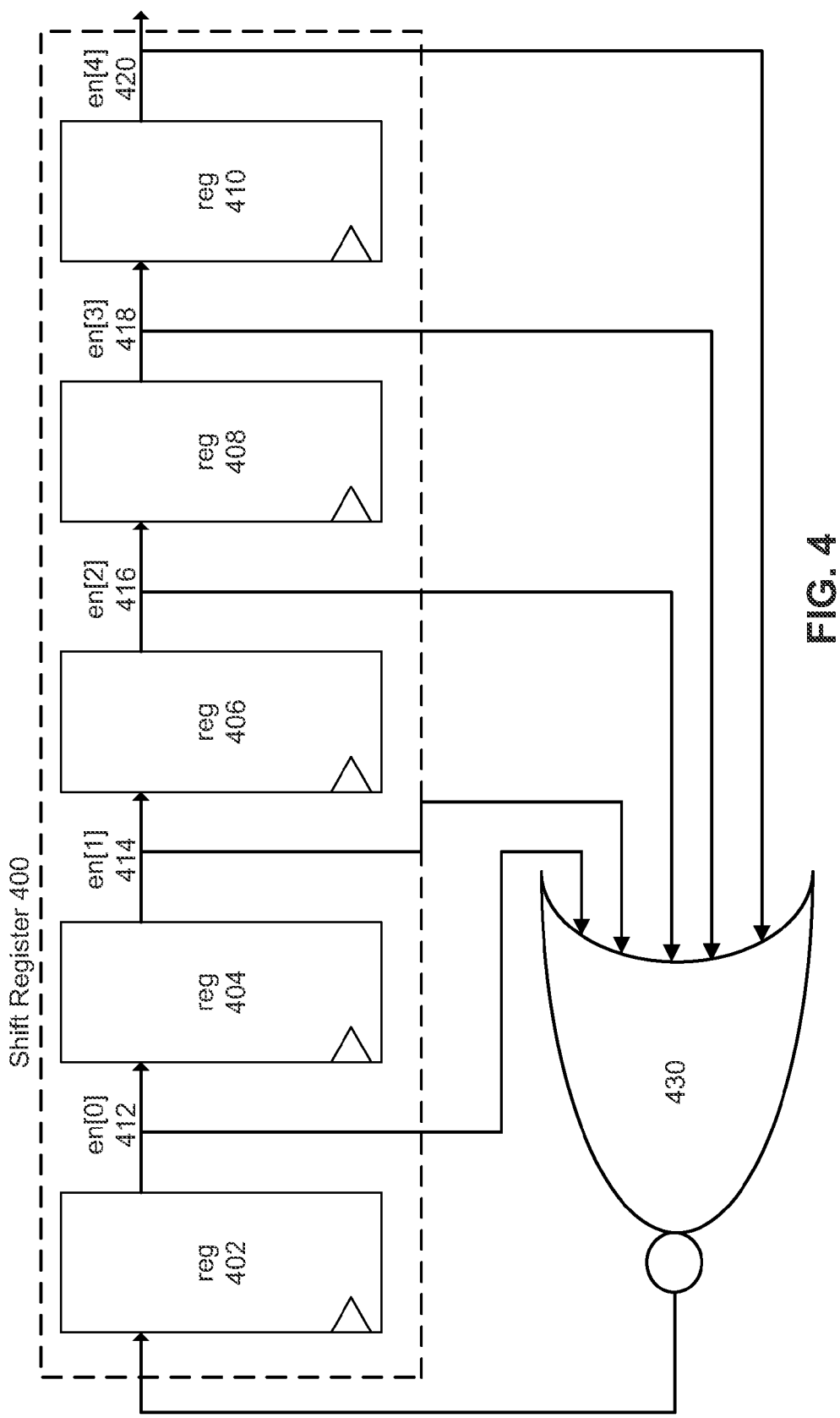
FIG. 4 is an illustration of self-correction logic for serial-to-parallel converters according to an embodiment of the disclosure.

FIG. 4 is an illustration of self-correction logic for serial-to-parallel converters according to an embodiment of the disclosure. In this embodiment, shift-register 400 is shown to include registers 402, 404, 406, 408 and 410; in other embodiments, said shift register may comprise any number of registers based on the SIPO utilizing the shift register for accumulating serial data.

en[0] 412, en[1] 414, en[2] 416, en[3] 418 and en[4] 420 represent the contents of registers 402, 404, 406, 408 and 410, respectively. To avoid the situation where the token-bit is lost (e.g., cycle 7 in Table 1 as discussed above) and the SIPO utilizing shift register 400 stops acquiring data, logic 430 determines when the token bit is lost. In this embodiment, logic 430 checks for the situation when all the bits in shift register 400 are at logic-0, then automatically injects a logic-1 at the input of register 402.

Logic 430 is illustrated in FIG. 4 as a 5-input NOR gate, which will produce a logic-1 when all of its inputs are at logic-0. This logic works as a self correction logic in a situation where the re-circulating token-bit gets lost. In other embodiments, tokens may comprise different logical values, and thus said self-correction logic may comprise different digital logic components.

Figure 5:
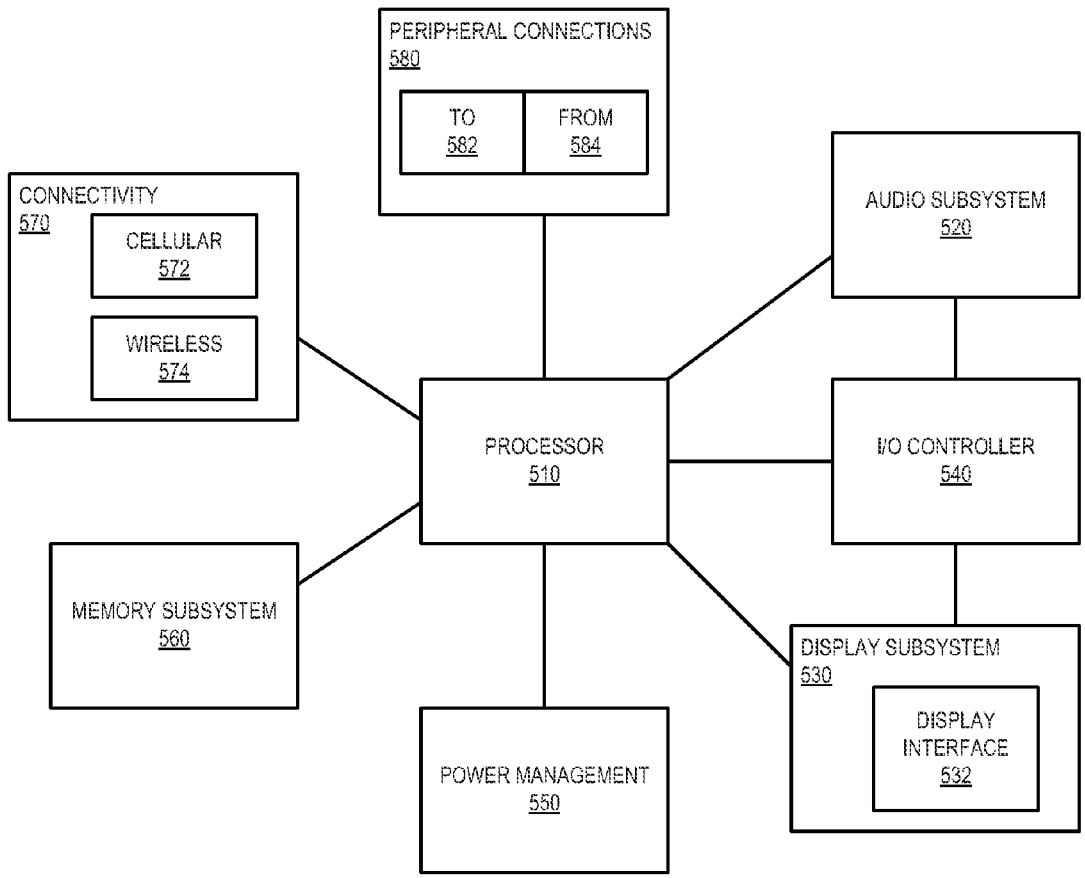
FIG. 5 is block diagram of a device to utilize self-correcting logic for serial-to-parallel converters according to an embodiment of the disclosure.

FIG. 5 is block diagram of a device to utilize self-correcting logic for serial-to-parallel converters according to an embodiment of the disclosure. Computing device 500 represents a mobile computing device, such as a computing tablet, a mobile phone or smartphone, a wireless-enabled e-reader, or other wireless mobile device. It will be understood that certain of the components are shown generally, and not all components of such a device are shown in device 500.

Device 500 includes processor 510, which performs the primary processing operations of device 500. Processor 510 can include one or more physical devices, such as microprocessors, application processors, microcontrollers, programmable logic devices, processor cores, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting device 500 to another device. The processing operations may also include operations related to audio I/O and/or display I/O.

In one embodiment, device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input via any of the audio jacks described above. Devices for such functions can be integrated into device 500, or connected to device 500. In one embodiment, a user interacts with device 500 by providing audio commands that are received and processed by processor 510.

Display subsystem 530 represents hardware (e.g., display devices) and software (e.g., drivers) components that provide a visual and/or tactile display for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touchscreen device that provides both output and input to a user.

I/O controller 540 represents hardware devices and software components related to interaction with a user. I/O controller 540 can operate to manage hardware that is part of audio subsystem 520 and/or display subsystem 530. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of device 500. Additionally, audio output can be provided instead of or in addition to display output. In another example, if display subsystem includes a touchscreen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, or other hardware that can be included in device 500. The input can be part of direct user interaction, as well as providing environmental input to the system to influence its operations (such as filtering for noise, adjusting displays for brightness detection, applying a flash for a camera, or other features). In one embodiment, device 500 includes power management 550 that manages battery power usage, charging of the battery, and features related to power saving operation.

Memory subsystem 560 includes memory devices for storing information in device 500. Memory can include nonvolatile (state does not change if power to the memory device is interrupted) and/or volatile (state is indeterminate if power to the memory device is interrupted) memory devices. Memory 560 can store application data, user data, music, photos, documents, or other data, as well as system data (whether long-term or temporary) related to the execution of the applications and functions of system 500.

Connectivity 570 includes hardware devices (e.g., wireless and/or wired connectors and communication hardware) and software components (e.g., drivers, protocol stacks) to enable device 500 to communicate with external devices. The device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 574 refers to wireless connectivity that is not cellular, and can include personal area networks (such as Bluetooth), local area networks (such as WiFi), and/or wide area networks (such as WiMax), or other wireless communication.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (e.g., downloading and/or uploading, changing, synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type. Said peripheral connection hardware may utilize self-correcting logic for serial-to-parallel data converters according to any of the embodiments of the invention described above.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. An apparatus comprising:
   a serial data input port to receive a plurality of serial data streams from a peripheral device, each of the serial data streams having one or more bits;
   a shift register chain;
   a plurality of data registers, wherein each shift register of the shift register chain is coupled to one of the data registers of the plurality of data registers, the plurality of data registers to store the received plurality of serial data streams based, at least in part, on a position of a register select value in shift register chain, the register select value to enable one of the plurality of data registers in a cycle; and
   self-correction logic to reset the register select value at a beginning register of the shift register chain in response to detecting the shift register chain does not enable any of the plurality of data registers in the cycle.

2. The apparatus of claim 1, the self-correction logic to further transmit a signal to the peripheral device for indicating the register select value is at the start of the shift register chain.

3. The apparatus of claim 1, wherein the plurality of serial data streams are received from an analog front end (AFE) of a peripheral device.

4. The apparatus of claim 1, wherein the register select value comprises a single bit value.

5. The apparatus of claim 1, further comprising:
   a de-multiplexer to receive the plurality of serial data streams from the plurality of data registers and to transmit a parallel data stream comprised of the plurality of serial data streams.

6. The apparatus of claim 1, wherein the serial data input port is included in a Peripheral Device Interconnect express (PCIe) physical (PHY) layer.

7. A system comprising:
   a processor;
   a memory;
   an antenna for receiving data to be stored in the memory;
   a serial data input port to receive a plurality of serial data streams from a peripheral device, each of the serial data streams having one or more bits;

a shift register chain;

a plurality of data registers, wherein each shift register of the shift register chain is coupled to one of the data registers of the plurality of data registers, the data registers to store the received plurality of serial data streams based, at least in part, on a position of a register select value in shift register chain, the register select value to enable one of the plurality of data registers in a cycle; and self-correction logic to reset the register select value at a beginning register of the shift register chain in response to detecting the shift register chain does not enable any of the plurality of data registers in the cycle.

8. The system of claim 7, the self correction logic to further transmit a signal to the peripheral device for indicating the register select value is at the start of the shift register chain.

9. The system of claim 7, wherein the plurality of serial data streams are received from an analog front end (AFE) of a peripheral device.

10. The system of claim 7, wherein the register select value comprises a single bit value.

11. The system of claim 7, further comprising:

a de-multiplexer to receive the plurality of serial data streams from the plurality of data registers and to transmit a parallel data stream comprised of the plurality of serial data streams.

12. The system of claim 7, wherein the serial data input port is included in a Peripheral Device Interconnect express (PCIe) physical (PHY) layer.

13. A method comprising:

receiving one of a plurality of serial data streams from a peripheral device, each of the serial data streams having one or more bits;

generating a register select value by a shift register chain, wherein an output of each shift register of the shift register chain enables one data register of a plurality of data registers;

in response to detecting a shift register chain includes a register select value, storing the received serial data stream in one of a plurality of data registers, wherein the one data register is selected based, at least in part, on a position of the register select value in the shift register chain, wherein one of the plurality of data registers is enabled in each cycle; and in response to detecting the shift register chain does not enable any of the plurality of data registers in the cycle, resetting the register select value at a beginning register of the shift register chain.

14. The method of claim 13, further comprising:

transmitting a signal to the peripheral device for indicating the register select value is at the start of the shift register chain.

15. The method of claim 13, wherein the plurality of serial data streams are received from an analog front end (AFE) of a peripheral device.

16. The method of claim 13, wherein the register select value comprises a single bit value.

17. The method of claim 13, further comprising:

de-multiplexing data stored in the plurality of registers to convert the plurality of serial data streams to parallel data.

* * * * *